United States Patent [19]

Groehl

[11] Patent Number: 4,983,926
[45] Date of Patent: Jan. 8, 1991

[54] NULL OFFSET VOLTAGE COMPENSATION FOR OPERATIONAL AMPLIFIERS

[75] Inventor: Lawrence R. Groehl, Eatontown, N.J.

[73] Assignee: The United States of America as represented by the Secretary of the Army, Washington, D.C.

[21] Appl. No.: 393,610

[22] Filed: Aug. 14, 1989

[51] Int. Cl.$^5$ .............................................. H03F 1/14
[52] U.S. Cl. .......................................... 330/51; 330/9
[58] Field of Search ...................... 307/201, 202.1, 491, 307/494; 330/9, 51; 341/155; 364/602, 807

[56] References Cited
U.S. PATENT DOCUMENTS
3,851,259  11/1974  Porawski .......................... 330/51 X Primary Examiner—Steven Mottola
Attorney, Agent, or Firm—Michael Zelenka; John M. O'Meara

[57] ABSTRACT

The null offset voltage of an operational amplifier is compensated with diodes connected at the output terminal thereof. These diodes are either forward biased and/or backbiased to block current flow from the operational amplifier until the output voltage thereof exceeds the offset voltage level.

17 Claims, 1 Drawing Sheet

NULL OFFSET VOLTAGE COMPENSATION FOR OPERATIONAL AMPLIFIERS

The invention described herein may be manufactured, used, and licensed by or for the Government for governmental purposes without the payment to me of any royalties thereon.

BACKGROUND OF THE INVENTION

The present invention relates generally to operational amplifiers (hereinafter op amps) and more particularly, to such amplifiers which are utilized in circuitry where low level signals are common, for example, digital circuitry.

As is well known in the electronic arts, most op amps generate an offset voltage output when null output conditions exist at the inverting and non-inverting inputs thereof. In fact, op amp manufacturers list this null offset voltage most prominently on their specifications sheets. Although this null offset voltage output presents few problems in circuitry where high level signals are common, such as in servo controllers, it is always a design consideration in other circuitry, for example where an op amp is connected as a comparator in an analog-to-digital converter. As recommended by op amp manufacturers, when this null offset voltage output presents a problem, active compensation therefor is commonly provided by applying a supplemental DC bias equal in magnitude and of opposite polarity to the offset voltage, at the appropriate power input terminal of the op amp. Of course, the energizing power supply or battery arrangement can be modified or a separate battery may be added to provide this active compensation. However, the cost and design complexity is increased significantly as the result of such compensation. Furthermore, such compensation does nothing to preclude the continuous power drain which is inherent to the null offset condition and is very undesirable for battery operated equipment.

SUMMARY OF THE INVENTION

It is the general object of the present invention to provide passive compensation for the null offset voltage output of op amps.

It is a specific object of the present invention to accomplish the above-stated general object by blocking current flow from the output of each op amp until the voltage output level thereof exceeds its null offset voltage level.

These and other objects are accomplished in accordance with the present invention by connecting at least one diode directly to each op amp output. The number of diodes required for each op amp will depend on whether the diodes are forward biased or backbiased and the magnitude of the null offset voltage to be compensated.

The scope of the present invention is only limited by the appended claims for which support is predicated on the preferred embodiments hereinafter set forth in the following description and the attached drawings wherein like reference characters relate to like parts throughout the several figures.

DESCRIPTION OF THE PREFERRED EMBODIMENTS

Figure 1:
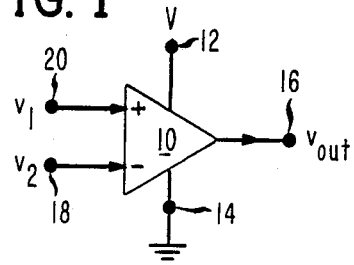
FIG. 1 is a schematic diagram for a signal comparator circuit that includes an op amp.

The meaning of "offset" in regard to op amps can be explained using FIG. 1, wherein an op amp 10 is arranged as a signal comparator which is commonly utilized in the computer arts to convert or translate between analog and digital signal levels. As is well known in the art of electronics, op amp 10 is always energized with a DC bias applied across positive and negative power input terminals, 12 and 14 respectively. This is accomplished in FIG. 1 by connecting a positive DC bias V to terminal 12 and connecting terminal 14 to ground. Otherwise, op amp 10 also includes an output terminal 16, as well as inverting and non-inverting signal input terminals, 18 and 20 respectively. For purposes of explanation, $v_1$ is designated as the signal applied to the non-inverting terminal 20 and $v_2$ is designated as the signal applied to the inverting terminal 18, while $v_{out}$ is designated as the signal at the output terminal 16. Ideally, when $v_1$ is equal to or greater than $v_2$, $v_{out}$ is the DC bias across terminals 12 and 14 (V in FIG. 1) and when $v_1$ is less than $v_2$, $v_{pout}$ is 0. If "offset" conditions exist for the op amp however, when $v_1$ is equal to or greater than $v_2$, $v_{out}$ is the DC bias across terminals 12 and 14 less the voltage offset and when $v_1$ is less than $v_2$, $v_{out}$ is the voltage offset. Except for the power drain which results therefrom, the null voltage offset is often inconsequential in those op amp applications where high level signals are utilized. However, where low level signals are utilized, such as in the digital computer arts, the null voltage offset presents major problems unless compensation is provided therefor.

Figure 2:
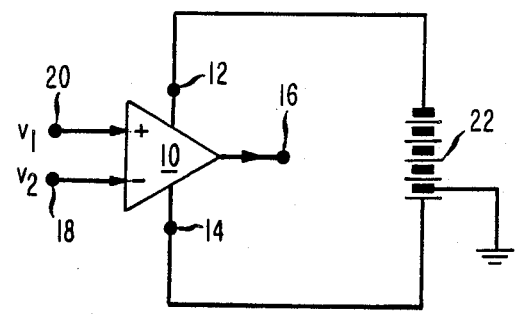
FIG. 2 is a schematic diagram for a signal comparator circuit of similar type to that of FIG. 1 and wherein a battery is connected to energize the op amp while also applying conventional null offset compensation thereto.

One very common means for providing such offset compensation is shown in FIG. 2 where a battery 22 is connected to apply both the DC bias and the offset compensation across terminals 12 and 14. Battery 22 is connected across the power input terminals 12 and 14 of the op amp 10 in the FIG. 2 arrangement and ground is connected to apply one cell thereof as the offset compensation to the negative power input terminal 14. Of course, the offset compensation must be precise and it can be applied through a variable voltage means (not shown), such as a potentiometer. Furthermore, offset compensation can be applied in other ways, such as with an auxiliary battery or power supply.

Figure 3:
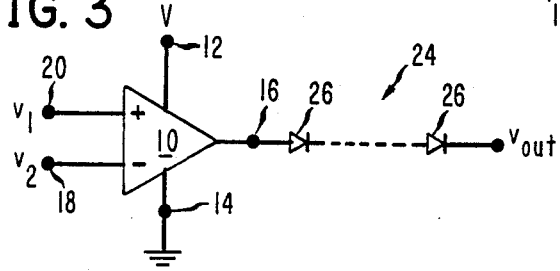
FIG. 3 is a schematic diagram for the signal comparator circuit of FIG. 1, having diodes connected therein to block current flow from the op amp in accordance with preferred embodiments of the invention.

As shown in FIG. 3, the present invention resolves the null offset problem for the signal comparator of FIG. 1 by incorporating means 24 for blocking current flow from the op amp output terminal 16 until the voltage level thereat exceeds the offset voltage level. Furthermore, the voltage level at which the blocking means 24 permits current flow, can be precisely predetermined to establish a digital threshold level beyond the offset voltage level. The signal comparator of FIG. 3 has many applications, such as to detect a single transition level in an analog-to-digital converter. As is well known to those skilled in the computer arts, the analog threshold level relating to a desired digital level transition is applied at one op amp input and the analog signal is applied at the other op amp input, while the digital level transition occurs at the op amp output. Of course, at which op amp input the analog threshold level is applied depends on whether the digital level transition is to be from low to high or from high to low.

In one preferred embodiment of the invention, the blocking means 24 includes at least one forward biased diode 26 connected at the op amp output terminal 16. Each forward biased diode 26 presents a voltage drop which must be overcome if current is to flow therethrough. Consequently, the output voltage level of the op amp 10 must exceed the accumulative voltage drop of all the forward biased diodes 26, if current is to flow from the output terminal 16 thereof. Depending on the magnitude of the offset voltage level therefore, the number of a particular diode required in the blocking means 24 can readily be calculated by simple division, using the offset voltage level or a digital threshold level beyond the offset voltage level as the numerator and the voltage drop characteristic of the selected diode as the denominator.

Of course, the voltage drop characteristic of any semiconductor diode depends upon the junction materials utilized in its fabrication. For the most common commercially available semiconductor diodes, the voltage drop characteristic can vary from approximately 0.1 volt to over 1.0 volt. Consequently, it is possible to select a combination of commercially available semiconductor diodes for nearly any desired accumulative voltage drop. Furthermore, backbiased or zener diodes could also be included in any such diode combination to facilitate the attainment of the accumulative voltage drop.

The concept of this invention may also be applied in the analog computer arts where signal levels are higher than in the digital computer arts and where op amps are commonly utilized to perform mathematical processes such as integration, addition and etc. Those skilled in the analog computer arts will certainly understand the functional aspects of the op amp circuitry that performs any mathematical process, without further explanation thereof being provided herein. Furthermore, such artisans will also have a full appreciation for the computational errors that result in those mathematical processes when the op amp circuitry is not compensated for the null offset voltage output and therefore no explanation thereof will be provided herein.

Figure 4:
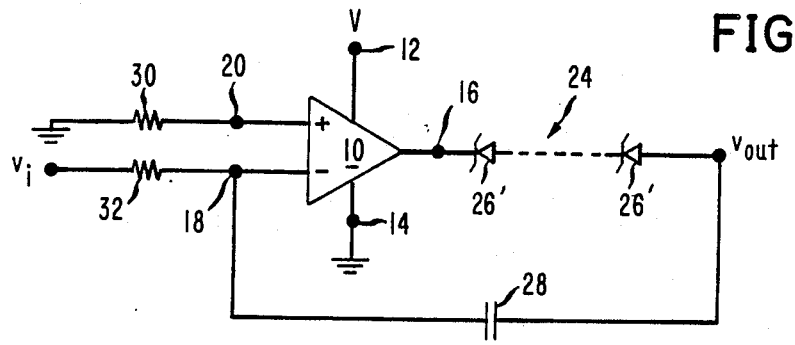
FIG. 4 is a schematic diagram for an integrator circuit that includes an op amp from which output current is blocked in accordance with preferred embodiments of the invention.

In op amp circuitry of the type for performing mathematical processes, the current blocking means 24 of the present invention may be incorporated to compensate for the null offset voltage output of each op amp and thereby preclude the computational errors that would otherwise result therefrom. An integrator with the current blocking means 24 of the invention incorporated into the circuitry thereof is illustrated in FIG. 4. The op amp 10 is conventionally connected in the integrator with its output $v_{out}$ supplying negative feedback to its inverting input terminal 18 through a capacitor 28. However, the current blocking means 24 is connected between the op amp output terminal 16 and the capacitor 28. As is also conventional, the op amp non-inverting input terminal 20 is grounded through a resistor 30 and the signal $v_1$ to be integrated is applied to the inverting input terminal 18 through a resistor 32. Although forward biased diodes could be included therein, the current blocking means 24 of FIG. 4 includes at least one backbiased (zener) diode 26' connected at the op amp output terminal 16.

Figure 5:
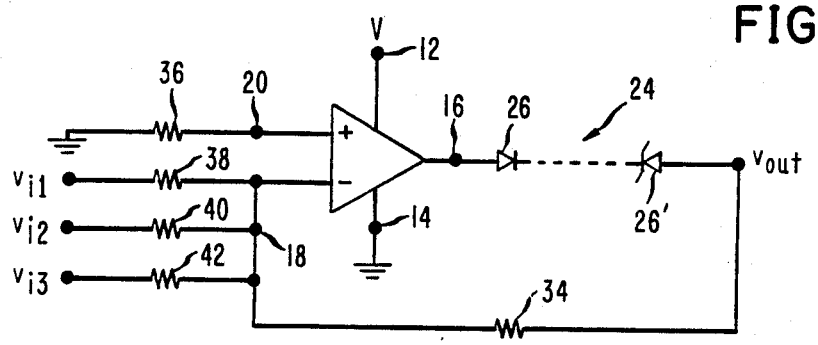
FIG. 5 is a schematic diagram for an adder circuit that includes an op amp from which output current is blocked in accordance with preferred embodiments of the invention.

An adder with the current blocking means 24 of the invention incorporated into the circuitry thereof is illustrated in FIG. 5. The op amp 10 is conventionally connected in the adder with its output $v_{out}$ supplying negative feedback to its inverting input terminal 18 through a resistor 34. However, the current blocking means 24 is connected between the op amp output terminal 16 and the resistor 34. As is also conventional, the op amp non-inverting input terminal 20 is grounded through a resistor 36 and the signals $v_{i1}$, $V_{i2}$, $v_{i3}$ to be added are applied to the inverting input terminal 18 through individual resistors 38, 40, and 42 respectively. Although either forward biased or backbiased diodes alone could be included therein, the current blocking means 24 of FIG. 5 includes at least one forward biased diode 26 and at least one back biased diode 26' connected at the op amp output terminal 16.

Those skilled in the art will appreciate without any further explanation that many modifications and variations are possible to the above disclosed embodiments of the null offset compensation, within the concept of this invention. Consequently, it should be understood that all such modifications and variations fall within the scope of the following claims.

What I claim is:

1. In circuitry of the type having at least one operational amplifier which generates an offset voltage output when null output conditions exist at the inputs thereof, the improvement comprising:

means for blocking current flow from the output of each said operational amplifier unless the output voltage thereof exceeds the offset voltage output thereof when other than null output conditions exist at the inputs of that operational amplifier.

2. The circuitry of claim 1 wherein said current blocking means includes at least one diode through which the output of each said operational amplifier is applied, said diodes for each said operational amplifier presenting an accumulative diode voltage drop greater than the offset voltage output level of that operational amplifier.

3. The circuitry of claim 2 wherein said diodes for each said operational amplifier are series connected to the output terminal of that operational amplifier, with each said diode being forward biased.

4. The circuitry of claim 2 wherein said diodes for each said operational amplifier are series connected to the output terminal of that operational amplifier, with each said diode being backbiased.

5. The circuitry of claim 2 wherein said diodes for each said operational amplifier are series connected to the output terminal of that operational amplifier, with at least one of said diodes being forward biased and at least one of said diodes being backbiased.

6. An analog-to-digital converter having one signal comparator for each transition level, comprising:

each said signal comparator including an operational amplifier with an output terminal and inverting and non-inverting input terminals, each said operational amplifier generating an offset voltage at its output terminal when null output conditions exist at its inverting and non-inverting input terminals; and means for blocking current flow from the output terminal of each said operational amplifier unless the output voltage thereof exceeds the offset voltage thereof when other than null output conditions exist at the input terminals of that operational amplifier.

7. The analog-to-digital converter of claim 6 wherein said current blocking means includes at least one diode through which the output of each said operational amplifier is applied, said diodes for each said operational amplifier presenting an accumulative diode voltage drop greater than the offset voltage output of that operational amplifier.

8. The analog-to-digital converter of claim 7 wherein said diodes for each said operational amplifier are series connected to the output terminal of that operational amplifier, with each said diode being forward biased.

9. The analog-to-digital converter of claim 7 wherein said diodes for each said operational amplifier are series connected to the output terminal of that operational amplifier, with each said diode being backbiased.

10. The analog-to-digital converter of claim 7 wherein said diodes for each said operational amplifier are series connected to the output terminal of that operational amplifier, with at least one of said diodes being forward biased and at least one of said diodes being backbiased.

11. Circuitry for performing a mathematical process, comprising:

at least one operational amplifier having an output terminal and inverting and non-inverting input terminals, each said operational amplifier generating an offset voltage at its output terminal when null output conditions exist at its inverting and non-inverting input terminals; and means for blocking current flow from the output terminal of each said operational amplifier unless the output voltage thereof exceeds the offset voltage thereof when other than null output conditions exist at the input terminals of that operational amplifier.

12. The circuitry of claim 11 wherein said current blocking means includes at least one diode through which the output of each said operational amplifier is applied, said diodes for each said operational amplifier presenting an accumulative diode voltage drop greater than the offset voltage output of that operational amplifier.

13. The circuitry of claim 12 wherein said diodes for each said operational amplifier are series connected to the output terminal of that operational amplifier, with each said diode being forward biased.

14. The circuitry of claim 12 wherein said diodes for each said operational amplifier are series connected to the output terminal of that operational amplifier, with each said diode being backbiased.

15. The circuitry of claim 12 wherein said diodes for each said operational amplifier are series connected to the output terminal of that operational amplifier, with at least one of said diodes being forward biased and at least one of said diodes being backbiased.

16. The circuitry of claim 11 wherein a signal applied to the inverting input terminal of at least one said operational amplifier is integrated by feeding back the output of that operational amplifier from said current blocking means through a capacitor to that same inverting input terminal.

17. The circuitry of claim 11 wherein a plurality of signals applied through individual resistors to the inverting input terminal of at least one said operational amplifier are summed by feeding back the output of that operational amplifier from said current blocking means through a resistor to that same inverting input terminal.

* * * * *